United States Patent
Cheng (10) Patent No.: US 11,424,352 B2
(45) Date of Patent: Aug. 23, 2022

(54) SEMICONDUCTOR STRUCTURE AND METHOD FOR MANUFACTURING THE SAME

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

(\*) Notice: Subject to any disclaimer, the term of this patent is extended or adjusted under 35 U.S.C. 154(b) by 235 days.

(21) Appl. No.: 16/819,533

(22) Filed: Mar. 16, 2020

(65) Prior Publication Data
US 2020/0219998 A1  Jul. 9, 2020

Related U.S. Application Data

(63) Continuation of application No. PCT/CN2018/109052, filed on Sep. 30, 2018.

(51) Int. Cl.
*H01L 29/66* (2006.01)
*H01L 29/778* (2006.01)
*H01L 29/20* (2006.01)

(52) U.S. Cl.
CPC ........ *H01L 29/778* (2013.01); *H01L 29/2003* (2013.01); *H01L 29/66462* (2013.01)

(58) Field of Classification Search
CPC ............... H01L 29/778; H01L 29/2003; H01L 29/66462
USPC .................................................. 257/192, 194
See application file for complete search history.

(56) References Cited

U.S. PATENT DOCUMENTS 7,728,356 B2 \* 6/2010 Suh .................... H01L 29/66462
257/194
10,050,137 B2 \* 8/2018 Morvan ................ H01L 29/207

FOREIGN PATENT DOCUMENTS

| CN | 102239551   | \* | 11/2011 |
| CN | 102239551 A |    | 11/2011 |
| CN | 102683394 A |    | 9/2012  |
| CN | 103943674 A |    | 7/2014  |
| CN | 104704637 A |    | 6/2015  |
| JP | 2007035905 A |   | 2/2007  |

OTHER PUBLICATIONS

International Search Report in corresponding PCT Application No. PCT/CN2018/109052, dated Jul. 2, 2019.
Written Opinion in corresponding PCT Application No. PCT/CN2018/109052, dated Jul. 2, 2019.

\* cited by examiner

*Primary Examiner* — Tan N Tran
(74) *Attorney, Agent, or Firm* — Westbridge IP LLC (57) ABSTRACT

The present application provides a semiconductor structure and a method for manufacturing the same. The semiconductor structure includes a channel layer, a barrier layer located on the channel layer, a composition change layer located on the barrier layer, and a p-type semiconductor material layer located in the gate region of the composition change layer, wherein a gate region is defined on a surface of the composition change layer, and a material of the composition change layer includes at least one composition change element.

20 Claims, 11 Drawing Sheets

SEMICONDUCTOR STRUCTURE AND METHOD FOR MANUFACTURING THE SAME

CROSS-REFERENCE TO RELATED APPLICATIONS

This application is a continuation of International Application No. PCT/CN2018/109052 filed on Sep. 30, 2018, the disclosure of which is hereby incorporated by reference in its entirety.

TECHNICAL FIELD

The present application relates to the microelectronic technologies, in particular to a semiconductor structure and a method for manufacturing the same.

BACKGROUND

High Electron Mobility Transistors (HEMTs) are one type of heterojunction field effect transistors. By taking an AlGaN/GaN heterojunction structure as an example, due to the presence of strong two-dimensional electron gas in the AlGaN/GaN heterojunction structure, AlGaN/GaN HEMTs are usually depletion devices, so that it is difficult to realize enhanced devices. However, in many cases, the application of the depletion devices is limited to a certain extent. For example, in the application of power switching devices, enhancement-mode (normally-closed) switching devices are required. Enhancement-mode GaN switching devices are mainly applied to high-frequency devices, the power switching devices, digital circuits, etc. It is of great significance to study the enhancement-mode GaN devices.

To realize the enhancement-mode GaN devices, an appropriate method is required to reduce concentration of carriers in a channel below a gate electrode when the gate voltage is zero. For example, a p-type semiconductor material is disposed in a gate region. However, it is found that this method has at least the following defects.

Forming the p-type semiconductor material in the gate region requires selective etching the p-type semiconductor located in all regions except for the gate region. However, it is very difficult to control the precise process for an etching thickness in an epitaxial direction, and it is very easy to over-etch the p-type semiconductor and thus etch the semiconductor material under the p-type semiconductor. Moreover, defects caused during etching may lead to a serious current collapse effect, and affect the stability and the reliability of the enhancement-mode GaN devices.

SUMMARY

At least one embodiment of the present application provides a semiconductor structure and a method for manufacturing the same, which can at least solve the problems of complicated manufacturing process and low stability and reliability of the prior semiconductor structure.

At least one embodiment of the present application provides a semiconductor structure, and the semiconductor structure includes a channel layer, a barrier layer located on the channel layer, a composition change layer located on the barrier layer, and a p-type semiconductor material layer formed in the gate region of the composition change layer, wherein a gate region is defined on a surface of the composition change layer, and a material of the composition change layer includes at least one composition change element.

For example, in the semiconductor structure according to at least one embodiment of the present application, a change curve of a component of the composition change element along an epitaxial direction includes one or more combinations of the following change stages: a periodic change, an increasing change, and a decreasing change.

For example, in the semiconductor structure according to at least one embodiment of the present application, the composition change layer adopts a periodic structure, and the periodic structure includes at least one period sequentially superimposed along the epitaxial direction, each period of the at least one period includes a first periodic layer and a second periodic layer sequentially superimposed along the epitaxial direction, and the composition change element exists in the first periodic layer.

For example, in the semiconductor structure according to at least one embodiment of the present application, a material of the composition change layer is a III-V compound, a material of the first periodic layer comprises at least one Group III element and at least one Group V element, a material of the second periodic layer comprises at least one Group III element and at least one Group V element.

For example, in the semiconductor structure according to at least one embodiment of the present application, the composition change layer adopts a periodic structure, and the periodic structure includes at least one period sequentially superimposed along the epitaxial direction, each period of the at least one period includes a first periodic layer and a second periodic layer sequentially superimposed along the epitaxial direction, and the composition change element exists in the second periodic layer.

For example, in the semiconductor structure according to at least one embodiment of the present application, a material of the composition change layer is a III-V compound, a material of the first periodic layer includes at least one Group III element and at least one Group V element, a material of the second periodic layer includes at least one Group III element and at least one Group V element.

For example, in the semiconductor structure according to at least one embodiment of the present application, the composition change element is a Group III element.

For example, in the semiconductor structure according to at least one embodiment of the present application, the composition change element is a Group V element.

For example, in the semiconductor structure according to at least one embodiment of the present application, the Group III element includes Al, Ga, and In.

For example, in the semiconductor structure according to at least one embodiment of the present application, the Group V element includes N.

For example, in the semiconductor structure according to at least one embodiment of the present application, the semiconductor structure further includes a groove located in the gate region of the composition change layer, and at least a portion of the p-type semiconductor material layer fills the groove.

For example, in the semiconductor structure according to at least one embodiment of the present application, the p-type semiconductor material layer includes one or more of the following: p-type diamond, p-type NiO, p-type GaN, p-type AlGaN, p-type InGaN, and p-type GaN/AlGaN.

For example, in the semiconductor structure according to at least one embodiment of the present application, the groove penetrates the composition change layer.

For example, in the semiconductor structure according to at least one embodiment of the present application, a source region and a drain region on both sides of the gate region are defined on a surface of the barrier layer.

For example, in the semiconductor structure according to at least one embodiment of the present application, the semiconductor structure further includes a source electrode located in the source region and in ohmic contact with the barrier layer and a drain electrode located in the drain region and in ohmic contact with the barrier layer.

For example, in the semiconductor structure according to at least one embodiment of the present application, the semiconductor structure further includes a nucleating layer and a buffer layer sequentially located under the channel layer.

At least one embodiment of the present application also provides a method for manufacturing a semiconductor structure, the method includes: sequentially forming a channel layer and a barrier layer; forming a composition change layer on the barrier layer, a gate region being defined on a surface of the composition change layer, and a material of the composition change layer including at least one composition change element; forming a p-type semiconductor material layer on a surface of the composition change layer; performing selective etching on the p-type semiconductor material layer to reserve the p-type semiconductor material layer in the gate region, and monitoring a component of the composition change element; and stopping the selective etching, in an event that a preset change curve is found.

For example, in the method for manufacturing the semiconductor structure according to at least one embodiment of the present application, before forming a p-type semiconductor material layer on a surface of the composition change layer, the method further includes: forming, in the gate region of the composition change layer, a groove extending toward the barrier layer.

For example, in the method for manufacturing the semiconductor structure according to at least one embodiment of the present application, the forming the p-type semiconductor material layer on the surface of the composition change layer includes: forming the p-type semiconductor material layer on a surface of the composition change layer, wherein the p-type semiconductor material layer covers the surface of the composition change layer and fills the groove.

For example, in the method for manufacturing the semiconductor structure according to at least one embodiment of the present application, a source region and a drain region located on both sides of the gate region are defined on a surface of the barrier layer.

For example, in the method for manufacturing the semiconductor structure according to at least one embodiment of the present application, the method further includes: etching away a portion of the semiconductor structure above the source region to expose the barrier layer, and forming, in the source region, a source electrode in ohmic contact with the barrier layer; and etching away a portion of the semiconductor structure above the drain region to expose the barrier layer, and forming, in the drain region, a drain electrode in ohmic contact with the barrier layer.

For example, in the method for manufacturing the semiconductor structure according to at least one embodiment of the present application, before preparing the channel layer, the method further includes: sequentially preparing a nucleating layer and a buffer layer.

In the semiconductor structure and the method for manufacturing the same provided in the embodiments of the present application, forming the composition change layer on the barrier layer may help reduce the process difficulty during etching the p-type semiconductor material layer. Specifically, when the p-type semiconductor material layer is being etched, a change of the component of the composition change element in the composition change layer can be monitored. In an event that the change of the component of the composition change element is found, it means that the composition change layer has started to be etched, and the etching process may be stopped at this time. Since the composition change layer may protect lower layers of the semiconductor structure, controlling the etching process by monitoring the component of the composition change element may avoid damage to the lower layers of the semiconductor structure caused by over-etching, so that defects caused by etching are reduced, the stability and the reliability of a device including the semiconductor structure are improved, and the process difficulty is reduced.

BRIEF DESCRIPTION OF DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION OF THE EMBODIMENTS

The present application will be described below in detail by specific implementations with reference to the accompanying drawings. However, these implementations do not constitute any limitations to the present application, and all structural, methodological or functional alterations made by a person of ordinary skill in the art according to these implementations shall fall into the protection scope of the present application.

Additionally, repetitive numbers or marks may be used in different embodiments. These repetitions are merely for briefly and clearly describing the present application, and do not represent any correlation between different embodiments and/or structures to be discussed.

Figure 7:
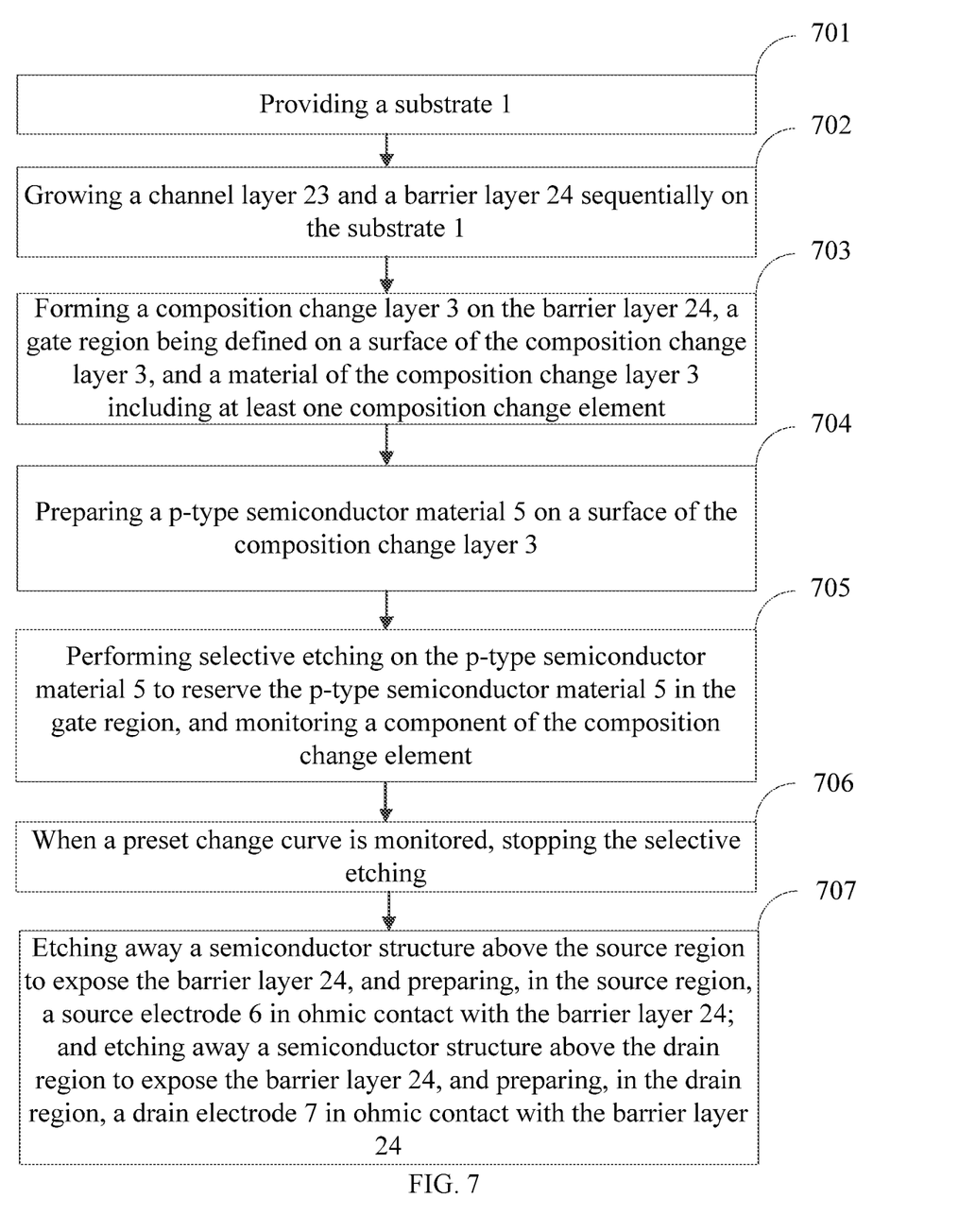
FIG. 7 is a schematic flowchart of a method for manufacturing a semiconductor structure according to an embodiment of the present application.

FIG. 7 is a schematic flowchart of a method for manufacturing a semiconductor structure according to an embodiment of the present application. As shown in FIG. 7, the method for manufacturing the semiconductor structure includes the following steps.

Figure 1:
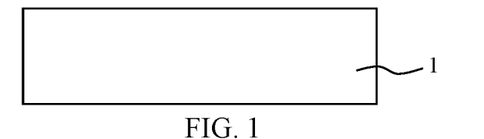
FIG. 1, FIG. 2, FIG. 3A, FIG. 3B, FIG. 4A, FIG. 4B, FIG. 5A, FIG. 5B, FIG. 5C, FIG. 5D, FIG. 5E, FIG. 6A, FIG. 6B, FIG. 6C, and FIG. 6D are exploded schematic diagrams of a semiconductor structure during a manufacturing process according to an embodiment of the present application.

Step 701: as shown in FIG. 1, providing a substrate 1. A material of the substrate 1 may include a semiconductor material, a ceramic material, a high polymer material, or the like. For example, the material of the substrate 1 may include sapphire, silicon carbide, silicon, lithium niobate, Silicon-on-Insulator (SOI), gallium nitride or aluminum nitride.

Figure 2:
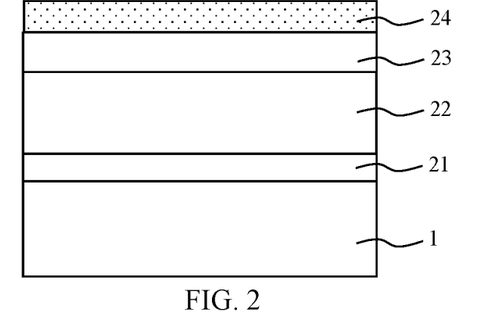

Step 702: as shown in FIG. 2, growing a channel layer 23 and a barrier layer 24 sequentially on the substrate 1. The channel layer 23 and the barrier layer 24 are made of semiconductor materials capable of forming a two-dimensional electron gas. For example, by taking a GaN-based material as an example, the channel layer 23 may be made of GaN, the barrier layer 24 may be made of AlGaN, and the channel layer 23 and the barrier layer 24 form a heterogeneous structure, so as to form the two-dimensional electron gas. Of course, the channel layer 23 and the barrier layer 24 may also be made of other materials. For example, by taking a GaAs-based material as an example, the channel layer 23 is made of GaAS, and the barrier layer 24 is made of AlGaAS.

In at least one further embodiment of the present application, in order to improve device performance and satisfy related technical requirements, epitaxial layers under the channel layer 23, such as a nucleating layer 21, a buffer layer 22, and the like, may be sequentially prepared before the channel layer 23 is prepared. For example, the semiconductor structure is a GaN-based semiconductor structure, in order to satisfy the technical requirements of reducing dislocation density and defect density, avoiding meltback, improving crystal quality, and the like, the method for manufacturing the GaN-based semiconductor structure may further include preparing the nucleating layer 21 on the substrate 1. The nucleating layer 21 may include one or more of AlN and AlGaN. In addition, in order to buffer a stress in an epitaxial structure above the substrate and avoid cracking of the epitaxial structure, the GaN-based semiconductor structure may further include the buffer layer 22 prepared above the nucleating layer 21. The buffer layer 22 may include one or more of GaN, AlGaN and AlInGaN.

Figure 3A:
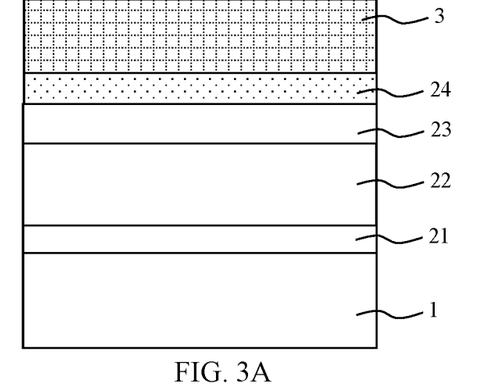

Step 703: as shown in FIG. 3A, forming a composition change layer 3 on the barrier layer 24. A gate region is defined on a surface of the composition change layer 3, and a material of the composition change layer 3 includes at least one composition change element.

The composition change layer 3 may be formed through growing in situ, or may be formed by one or combination of Atomic Layer Deposition (ALD), Chemical Vapor Deposition (CVD), Molecular Beam Epitaxy (MBE), Plasma Enhanced Chemical Vapor Deposition (PECVD), Low Pressure Chemical Vapor Deposition (LPCVD), Metal-Organic Chemical Vapor Deposition (MOCVD). It should be understood that the method for forming the composition change layer 3 described here is merely an example, and in the present application, the composition change layer 3 may be formed by any method known to those skilled in the art.

Figure 8:
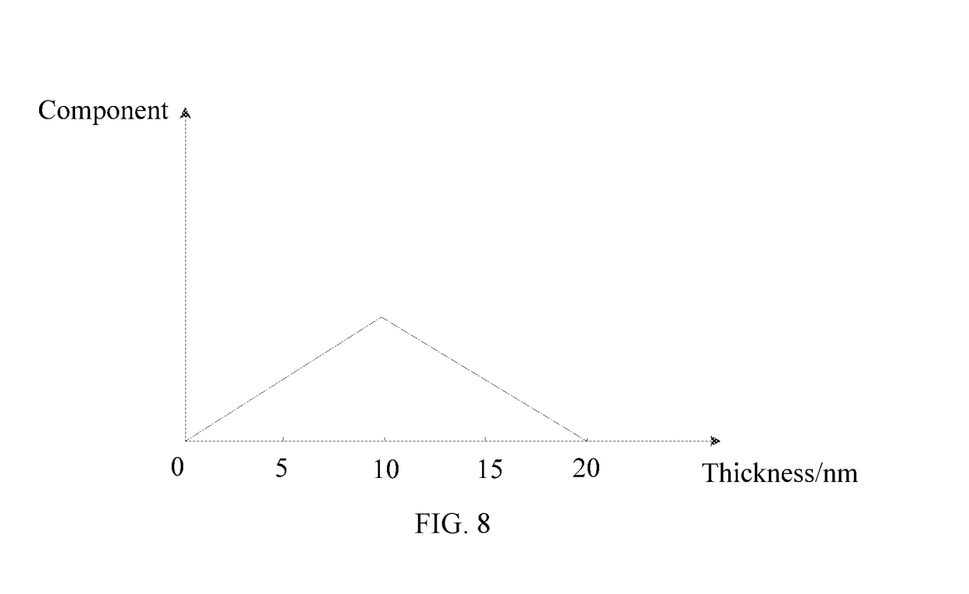
FIG. 8, FIG. 9A, FIG. 9B, FIG. 10A, and FIG. 10B are schematic diagrams of a change curve of a component of a composition change element in a semiconductor structure according to an embodiment of the present application.

A change curve of a component of the composition change element along an epitaxial direction includes one or more combinations of a periodic change, an increasing change, and a decreasing change. For example, as shown in FIG. 8, the change curve of the composition change element may be composed of a stage of the increasing change (in a range of 0 nm to 10 nm along the epitaxial direction) and a stage of the decreasing change (in a range of 10 nm to 20 nm along the epitaxial direction). It should be noted that, the specific change curve of the component of the composition change element is not limited in the present application.

Figure 5A:
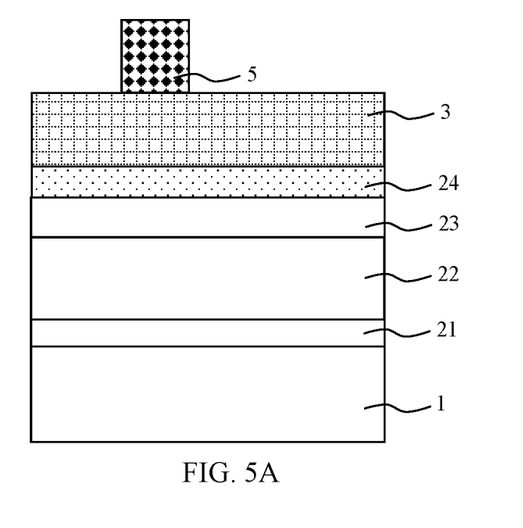
Figure 5B:
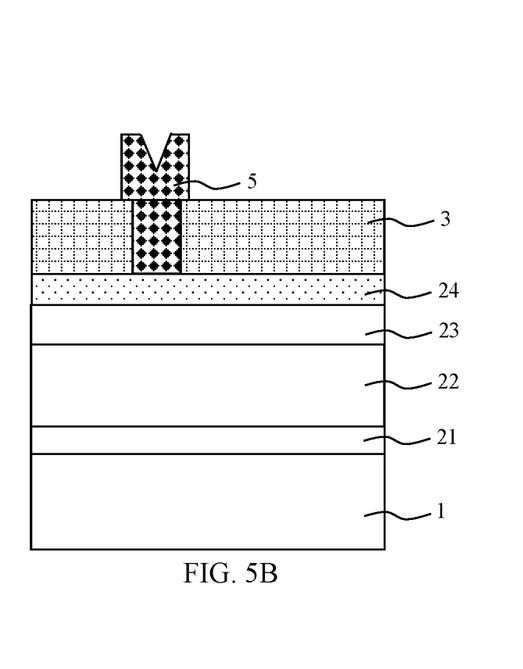
Figure 5C:
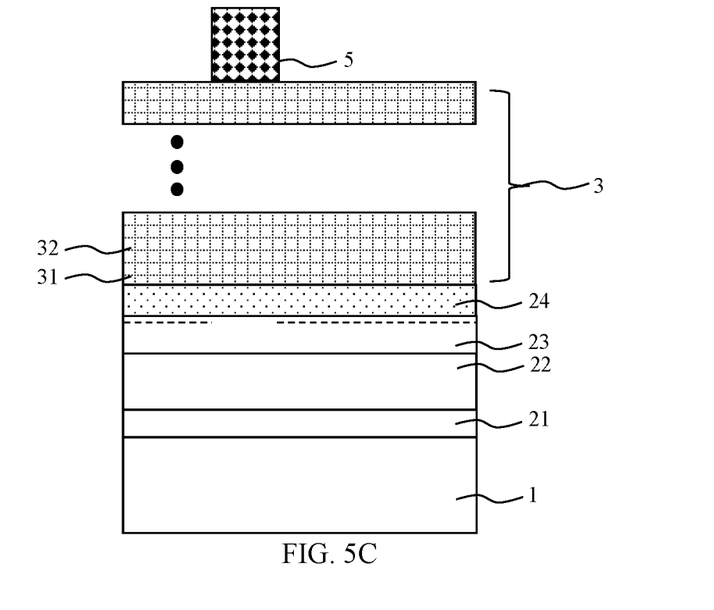

In an embodiment of the present application, as shown in FIG. 5C, the composition change layer 3 may adopt a periodic structure. The periodic structure includes at least one period sequentially superimposed along the epitaxial direction, and each period of the at least one period includes a first periodic layer 31 and a second periodic layer 32 sequentially superimposed along the epitaxial direction. The composition change element exists in the first periodic layer or the second periodic layer, which may effectively avoid over-etching of the lower layers of the semiconductor structure due to a reaction delay of a composition monitoring system.

Figure 4A:
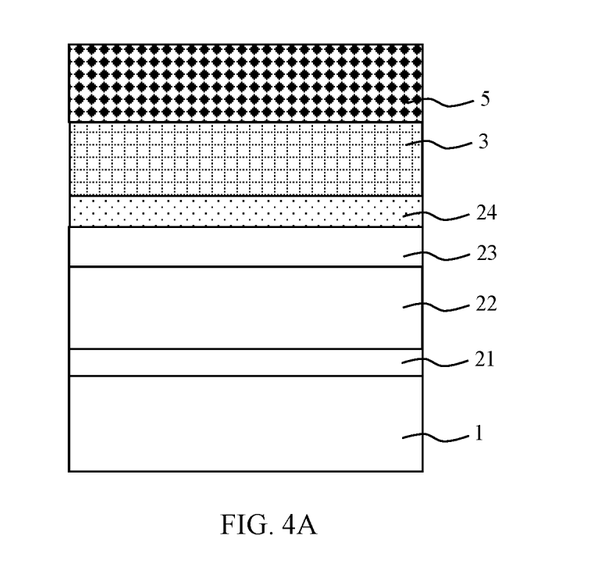

Step 704: as shown in FIG. 4A, preparing a p-type semiconductor material layer 5 on a surface of the composition change layer 3. For example, the semiconductor structure is a GaN-based semiconductor structure, the p-type semiconductor material layer 5 may include, for example, one or more of the following materials: p-type diamond, p-type NiO, p-type GaN, p-type AlGaN, p-type InGaN and p-type GaN/AlGaN.

Step 705: performing selective etching on the p-type semiconductor material layer 5 to reserve the p-type semiconductor material layer 5 in the gate region, and monitoring a component of the composition change element.

Step 706: when a preset change curve is found, stopping the selective etching. In this embodiment, the semiconductor structure after stopping the selective etching is shown in FIG. 5A.

The preset change curve is the change curve of the component of the composition change element in the composition change layer 3 along the epitaxial direction. Specifically, when the preset change curve is found, it means that the composition change layer has started to be etched, and the etching process may be stopped at this time. Since the composition change layer may protect the lower layers of the semiconductor structure, controlling the etching process by monitoring the component of the composition change element may avoid damage to the lower layers of the semiconductor structure caused by over-etching, so that defects caused by etching are reduced, the stability and the reliability of the device are improved, and the process difficulty is reduced.

In an embodiment of the present application, the component of the composition change element in the composition change layer 3 adopts a periodic change. The periodic change may include a plurality of periods, which may effectively avoid over-etching of the lower layers of the semiconductor structure due to a reaction delay of a composition monitoring system.

Figure 6A:
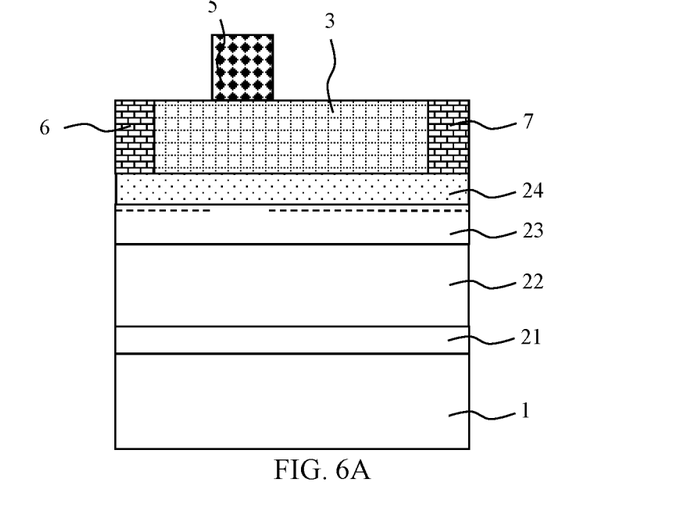

Step 707: as shown in FIG. 6A, etching away a portion (for example, a portion of the composition change layer 3 that overlaps the source region) of the semiconductor structure above the source region to expose the barrier layer 24, and preparing, in the source region, a source electrode 6 in ohmic contact with the barrier layer 24; and etching away a portion (for example, a portion of the composition change layer 3 that overlaps the drain region) of the semiconductor structure above the drain region to expose the barrier layer 24, and preparing, in the drain region, a drain electrode 7 in ohmic contact with the barrier layer 24.

Figure 6B:
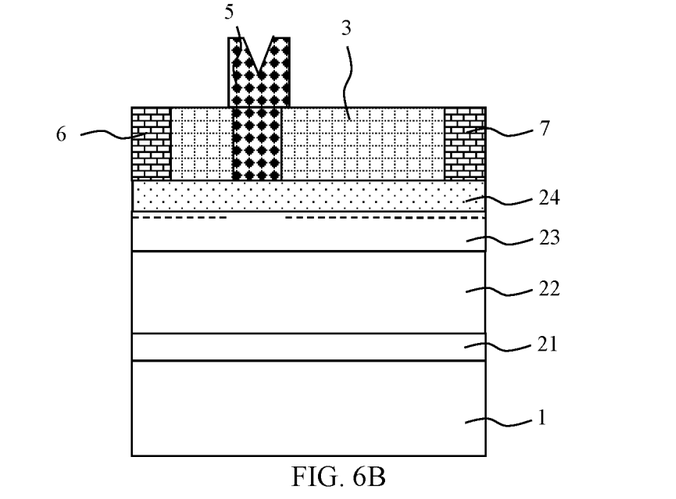
Figure 6C:
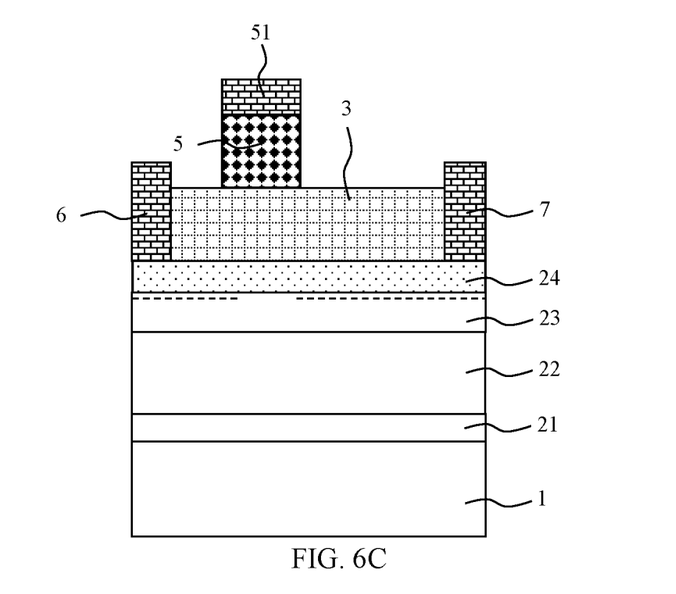

The p-type semiconductor material layer 5 may be directly used as a gate electrode (as shown in FIG. 6A), or an electrode material 51 may also be fabricated on the p-type semiconductor material layer 5 to serve as a gate electrode (as shown in FIG. 6C). It should be understood that, the source electrode 6, the drain electrode 7 and the electrode material 51 on the p-type semiconductor material layer 5 may be made of a metal material, for example nickel alloy, or may be made of a metal oxide or semiconductor material. The specific material used for preparing the source electrode 6, the source electrode 7 and the electrode material 51 on the p-type semiconductor material layer 5 is not limited in the present application.

In a process of preparing the semiconductor structure by using the method for manufacturing the same provided by the embodiments of the present application, forming the composition change layer 3 on the barrier layer 24 may help reduce a process difficulty during etching the p-type semiconductor material layer 5. Specifically, when the p-type semiconductor material layer 5 is etched, change of the component of the composition change element in the composition change layer 3 may be found. When the change of the component of the composition change element is found, it means that the composition change layer 3 has started to be etched, and the etching process may be stopped at this time. Since the composition change layer 3 may protect the lower layers of the semiconductor structure, controlling the etching process by monitoring the component of the composition change element may avoid damage to the lower layers of the semiconductor structure caused by over-etching, so that defects caused by etching are reduced, the stability and the reliability of the device are improved, and the process difficulty is reduced.

Figure 3B:
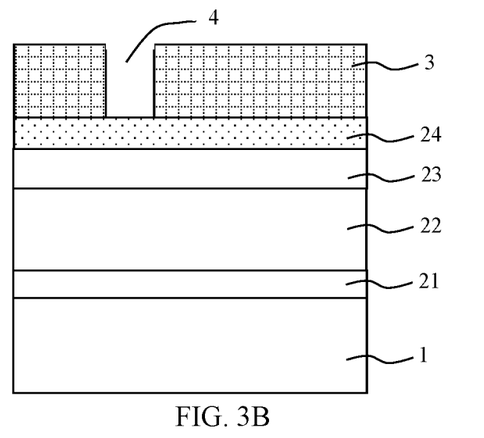
Figure 4B:
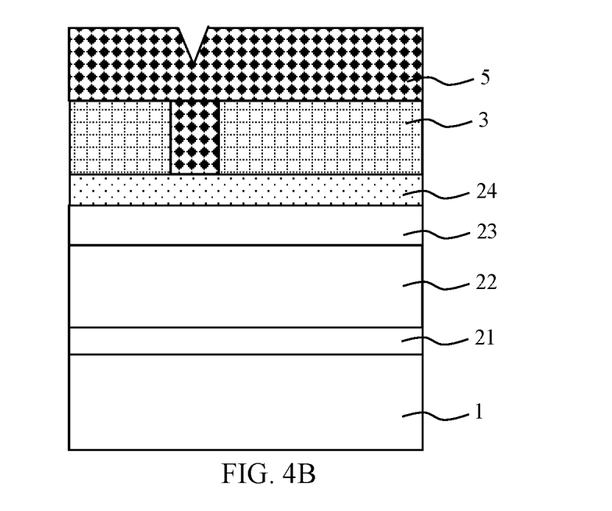

In an embodiment of the present application, in order to further improve the performance of the semiconductor structure and further reduce a density of a two-dimensional electron gas in the channel layer 23 under the gate region, as shown in FIG. 3B, a groove 4 extending toward the barrier layer 24 may be formed in the gate region before the p-type semiconductor material layer 5 is prepared. The etching process of the groove may be, for example, performed by chlorine-based plasma etching. Due to a selectivity of fluorine-based plasma etching, the etching process is stopped when etching is carried out to the barrier layer 24. After the groove 4 is formed, as shown in FIG. 4B, the p-type semiconductor material layer 5 covering the groove 4 is first formed above the barrier layer 24; then the selective etching is performed on the p-type semiconductor material layer 5 to reserve a portion of the p-type semiconductor material layer 5 in the groove 4, so as to form the semiconductor structure shown in FIG. 5B. The semiconductor structure after the source electrode 6 and the drain electrode 7 are prepared may be shown in FIG. 6B. It should be understood that, in some other embodiments of the present application, considering that as long as the p-type semiconductor material layer 5 is prepared in the gate region, the purposes of pinching off an n-type conductive layer under a gate electrode may be achieved, the method for manufacturing the semiconductor structure may not include a process of preparing the groove 4, and the p-type semiconductor material layer can be directly prepared on the gate region on the surface of the composition change layer 3. Whether or not the groove 4 needs to be prepared in the semiconductor structure is not limited in the present application.

Figure 5D:
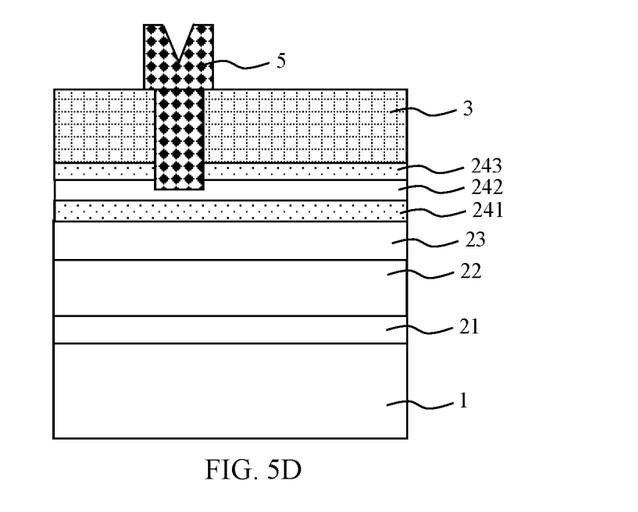

It should be understood that, although it is shown in FIG. 5B that the groove 4 completely penetrates the composition change layer 3 and rests on a bottom surface of the composition change layer 3, in some other embodiments of the present application, it is also possible that the groove 4 completely penetrates not only the composition change layer 3, but also penetrates a portion of the barrier layer 24. For example, as shown in FIG. 5D, in a case where the barrier layer 24 is of a sandwich structure, the groove 4 may penetrate to a middle layer 242 in the sandwich structure of the barrier layer 24. In this case, the middle layer 242 may function as a stop layer in the local etching process of forming the groove 4, so as to protect a first outer interlayer 241 on a surface of the channel layer 23 from being damaged by the local etching process. The sandwich structure includes the first outer interlayer 241 prepared on the surface of the channel layer 23, a second outer interlayer 243, and the middle layer 242 sandwiched between the first outer interlayer 241 and the second outer interlayer 243. It should be understood that materials of the first outer interlayer 241, the middle layer 242 and the second outer interlayer 243 may be adjusted according to the material of the channel layer 23. For example, by taking a GaN-based material as an example, in a case where the channel layer 23 is made of GaN, the first outer interlayer 241 and the second outer interlayer 243 may be made of AlGaN or AlInGaN, and the middle layer 242 may be made of GaN, where a content of each of Al, In and Ga may vary from 0 to 1. It should be noted that, the materials of the first outer interlayer 241, the middle layer 242 and the second outer interlayer 243 are not specifically limited in the present application.

Figure 5E:
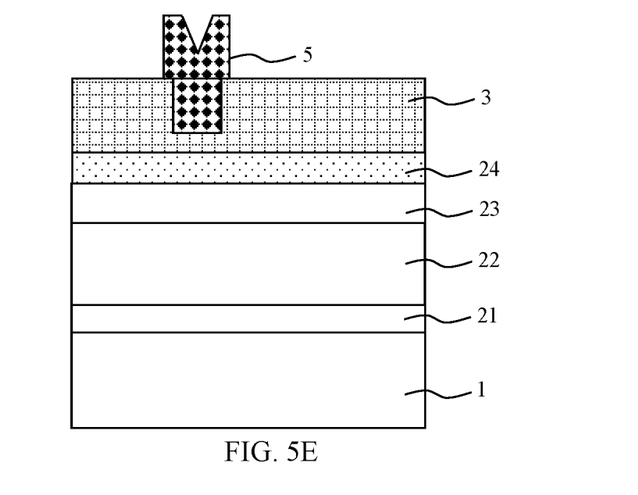

In another embodiment of the present application, as shown in FIG. 5E, the groove 4 may also partially penetrate the composition change layer 3, and the bottom surface of the groove 4 rests the inside of the composition change layer 3. The depth of the groove 4 is not strictly limited in the present application as long as the p-type semiconductor material layer 5 inside the groove 4 can pinch off the n-type conductor layer below the gate electrode so as to realize the semiconductor structure.

FIG. 5A is schematic structural diagram of a semiconductor structure according to an embodiment of the present application. As shown in FIG. 5A, the semiconductor structure includes a channel layer 23, a barrier layer 24 formed on the channel layer 23, a composition change layer 3 formed on the barrier layer 24, and a p-type semiconductor material layer 5 formed in the gate region of the composition change layer 3. A gate region is defined on a surface of the composition change layer 3, and a material of the composition change layer 3 includes at least one composition change element.

In an embodiment of the present application, the channel layer 23 and the barrier layer 24 are sequentially prepared on the substrate 1, and a material of the substrate 1 may include a semiconductor material, a ceramic material, or a high polymer material. For example, the material of the substrate 1 may include sapphire, silicon carbide, silicon, lithium niobate, Silicon-on-Insulator (SOI), gallium nitride, or aluminum nitride. The channel layer 23 and the barrier layer 24 may be semiconductor materials capable of forming a two-dimensional electron gas. For example, by taking a GaN-based material as an example, the channel layer 23 may be made of GaN, the barrier layer 24 may be made of AlGaN, and the channel layer 23 and the barrier layer 24 form a heterogeneous structure, so as to form the two-dimensional electron gas. It should be understood that, the channel layer 23 and the barrier layer 24 may also be made of other materials, such as a GaAs-based material, the channel layer 23 is made of GaAS, and the barrier layer 24 is made of AlGaAS.

In at least one further embodiment of the present application, in order to improve device performance and satisfy related technical requirements, epitaxial layers under the channel layer 23, such as a nucleating layer 21, a buffer layer 22, and the like, may be sequentially prepared before the channel layer 23 is prepared. For example, the semiconductor structure is a GaN-based semiconductor structure, in order to satisfy the technical requirements of reducing dislocation density and defect density, avoiding meltback, improving crystal quality, and the like, the method for manufacturing the GaN-based semiconductor structure may further include preparing the nucleating layer 21 on the substrate 1. The nucleating layer 21 include one or more of AlN and AlGaN. In addition, in order to buffer a stress in an epitaxial structure above the substrate and avoid cracking of the epitaxial structure, the GaN-based semiconductor structure may further include the buffer layer 22 prepared above the nucleating layer 21. The buffer layer 22 may be made of one or more of GaN, AlGaN and AlInGaN.

In an embodiment of the present application, the p-type semiconductor material layer 5 may be selected from the corresponding semiconductor materials according to the materials of the channel layer 23 and the barrier layer 24. For example, the semiconductor structure of the present application is a GaN-based semiconductor structure, the p-type semiconductor material layer 5 may include one or more of p-type diamond, p-type NiO, p-type GaN, p-type AlGaN, p-type InGaN, and p-type GaN/AlGaN.

It can be seen that, forming the composition change layer 3 on the barrier layer 24 may help reduce the process difficulty during etching the p-type semiconductor material layer 5. Specifically, when the p-type semiconductor material layer 5 is etched, change of the component of the composition change element in the composition change layer 3 can be found. When the change of the component of the composition change element is found, it means that the composition change layer 3 has started to be etched, and the etching process may be stopped at this time. Since the composition change layer 3 may protect the lower layers of the semiconductor structure, controlling the etching process by monitoring the component of the composition change element may avoid damage to the lower layers of the semiconductor structure caused by over-etching, so that defects caused by etching are reduced, the stability and the reliability of the device are improved, and the process difficulty is reduced.

In an embodiment of the present application, a change curve of a component of the composition change element in the composition change layer 3 along the epitaxial direction includes one or more combinations of a periodic change, an increasing change, and a decreasing change. For example, as shown in FIG. 8, the change curve of the composition change element may be composed of a stage of the increasing change (in a range of 0 nm to 10 nm along the epitaxial direction) and a stage of the decreasing change (in a range of 10 nm to 20 nm along the epitaxial direction). In this way, when selective etching of the composition change layer 3 is to be started, with the progress of the etching process, when it is found that the component of the composition change element reaches the apex shown in FIG. 8, it means that a half of a thickness of the composition change layer 3 already has been etched away. At this time, the etching may be stopped after etching another thickness of 10 nm.

It should be understood that, as long as the composition monitoring process of the composition change element can grasp the etching progress of the composition change layer 3, a composition change mode of the composition change element in the composition change layer 3 may be adjusted according to the actual application scenario, so that when a portion of the composition change layer 3 that needs to be etched along the epitaxial direction has been etched, the etching may be stopped in time. The composition change mode of the composition change element in the composition change layer 3 is not strictly limited in the present application.

Figure 9A:
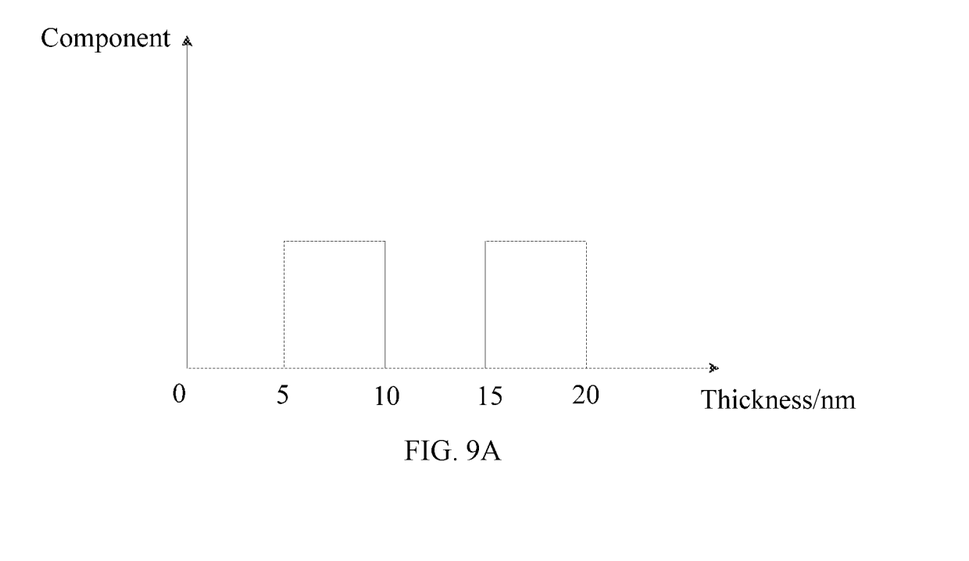

In an embodiment of the present application, as shown in FIG. 5C, the composition change layer 3 may adopt a periodic structure. The periodic structure includes at least one period sequentially superimposed along the epitaxial direction, and each period of the at least one period includes a first periodic layer 31 and the second periodic layer 32 sequentially superimposed along the epitaxial direction. The composition change element exists only in the first periodic layer 31 or the second periodic layer 32, which may effectively avoid over-etching of the lower layers of the semiconductor structure due to a reaction delay of a composition monitoring system. For example, a material of the first periodic layer 31 is GaN and a material of the second periodic layer 32 is AlGaN, the composition change element is Al existing only in the second periodic layer 32. For example, a preset preparation thickness of each periodic layer is 5 nm, the periodic structure of the composition change layer 3 formed is made of 5 nm GaN, 5 nm AlGaN, 5 nm GaN, and 5 nm AlGaN, etc., so that the change curve of the component of the composition change element in the epitaxial direction is in a change of a "sawtooth" periodic, as shown in FIG. 9A.

Figure 9B:
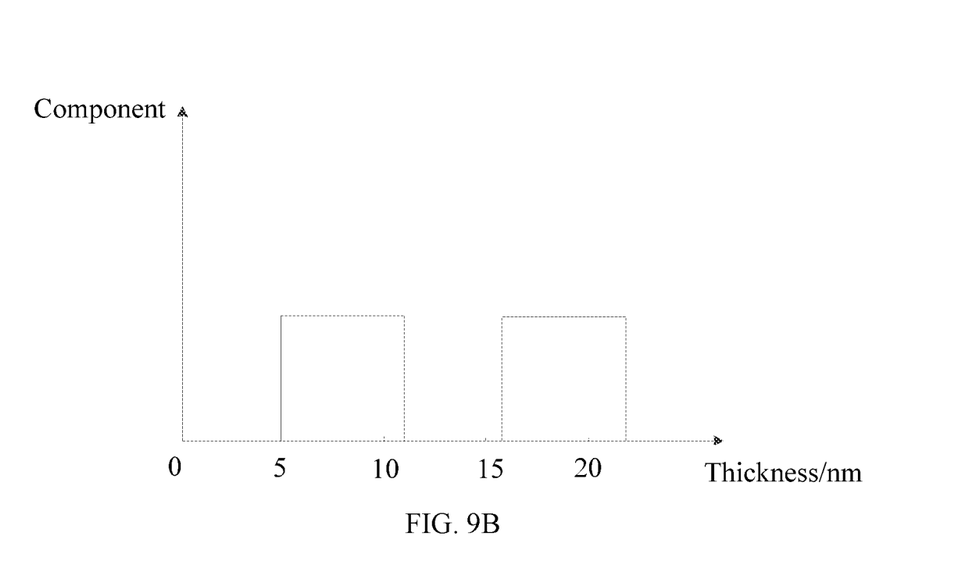

In another embodiment of the present application, the preset preparation thickness of each periodic layer may not remain the same. For example, the first periodic layer 31 in the periodic structure of the composition change layer 3 may be made of 5 nm GaN, and the second periodic layer 32 is made of 6 nm AlGaN. In this way, the change curve of the component of the composition change element in the epitaxial direction is also in a change of "sawtooth" periodic. In this case, a width of each "tooth" in the "sawtooth" is wider than a width of a region without "tooth" in the "sawtooth", as shown in FIG. 9B.

It can be seen that, since Al exists only in the second periodic layer 32, in an entire composition change layer, actually, the component of Al changes periodically along the epitaxial direction. When selective etching is performed on the composition change layer 3, the etching may be stopped when it is monitored that the first periodic layer 31 closest to the barrier layer 24 has been etched. For example, when the composition change layer 3 includes two periods, the periodic structure includes an L1 layer (5 nm GaN), an L2 layer (5 nm AlGaN), an L3 layer (5 nm GaN), and an L4 layer (5 nm AlGaN) which are sequentially superimposed along the epitaxial direction. In an event that the selective etching of the composition change layer 3 is to be started, the L4 layer on the surface of the composition change layer 3 includes an Al element. As the progress of the etching processes, when it is monitored that the Al element disappeared, it indicated that the L3 layer has started to be etched. When it is monitored that the Al element is appeared again, it indicates that the L2 layer has started to be etched. Then, when the Al element disappears again, it means that the L1 layer has started to be etched. At this time, an etching rate may be slowed down, and the etching may be stopped after continuing to etch a thickness of 5 nm, so as to ensure that a portion of the composition change layer 3 to be etched is just etched away along the epitaxial direction without damaging the lower layers of the semiconductor structure.

It should be understood that although the periodic structure of the composition change layer is described above by taking the material of the first periodic layer 31 as GaN and the material of the second periodic layer 32 as AlGaN as an example, however, in some other embodiments, the composition change layer 3 may be made of other Group III-V compounds, or made of other materials. Foe example, in a case that the composition change layer 3 is made of the Group III-V compound, the material of the first periodic layer 31 includes at least one Group III element and at least one Group V element, and the material of the second periodic layer 32 includes at least one Group III element and at least one Group V element. For example, in some embodiments of the present application, the composition change element is a Group III element or a Group V element. For example, in some embodiments of the present application, the Group III element may include at least one of Al, Ga, and In. For example, in some embodiments of the present application, the Group V element may include N. The types of specific elements included in the composition change layer is not strictly limited in the present application.

In an embodiment of the present application, the first periodic layer 31 in the periodic structure of the composition change layer 3 may be made of 5 nm GaN, and the second periodic layer 32 is made of 5 nm InGaN. In this way, in a case where the composition change layer 3 includes two periods, by taking the preset preparation thickness of 5 nm for each periodic layer as an example, the periodic structure is made of 5 nm GaN, 5 nm InGaN, 5 nm GaN, and 5 nm InGaN which are sequentially superimposed along the epitaxial direction. In another embodiment, the preset preparation thickness of each periodic layer may not remain the same. For example, the first periodic layer 31 in the periodic structure of the composition change layer 3 may be made of 5 nm GaN, and the second periodic layer 32 may be made of 6 nm InGaN.

In another embodiment of the present application, as shown in FIG. 5C, the composition change layer 3 still adopts the above-mentioned periodic structure. The composition change element still exists only in the first periodic layer 31 or the second periodic layer 32, and the component of the composition change element appears as a monotonic change, such as the increasing change or the decreasing change.

For example, in an embodiment of the present application, the composition change layer 3 may include two periods.

The first periodic layer 31 in a first period is made of 5 nm GaN, and the second periodic layer 32 is made of 5 nm $Al_{0.6}Ga_{0.4}N$;

The first periodic layer 31 in a second period is made of 5 nm GaN, and the second periodic layer 32 is made of 5 nm $Al_{0.5}Ga_{0.5}N$.

Figure 10A:
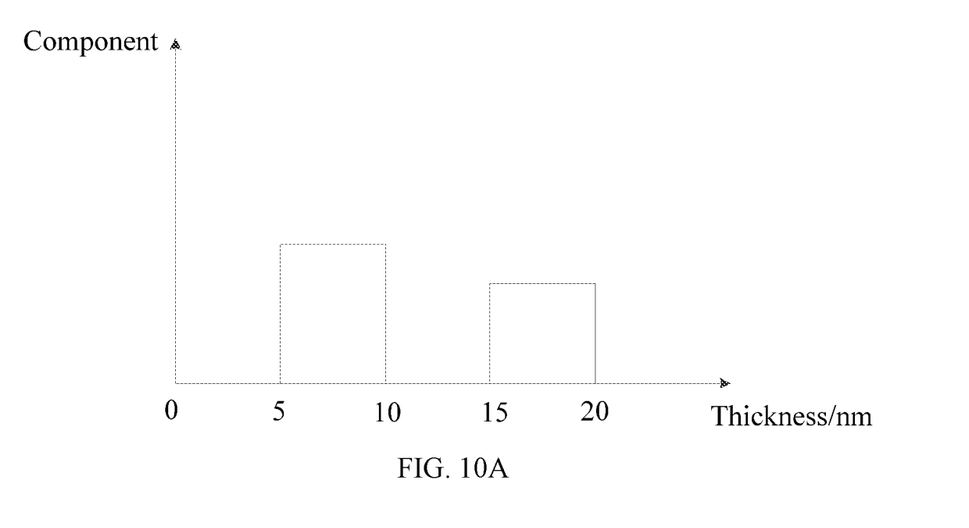

In this embodiment, in the entire composition change layer 3, the component of Al decreases along the epitaxial direction. Al may be used as a composition change element, and the change of the component of Al along the epitaxial direction still appears to be a "sawtooth" periodic change curve. But a height of each "tooth" of the "sawtooth" is decreasing, as shown in FIG. 10A. The etching process may be controlled by monitoring the component of Al of the composition change element, for example, when it is monitored, through the composition monitoring process, that the first periodic layer 31 closest to the barrier layer 24 has been etched along the epitaxial direction, the process of the selective etching may be stopped.

In another embodiment of the present application, the preset preparation thickness of the periodic layer in each period of the composition change layer 3 may not remain the same. For example, the composition change layer 3 may include the following two periods.

The first periodic layer 31 in the first period is made of 5 nm GaN, and the second periodic layer 32 is made of 6 nm $Al_{0.6}Ga_{0.4}N$;

The first periodic layer 31 in the second period is made of 5 nm GaN, and the second periodic layer 32 is made of 6 nm $Al_{0.5}Ga_{0.5}N$.

Figure 10B:
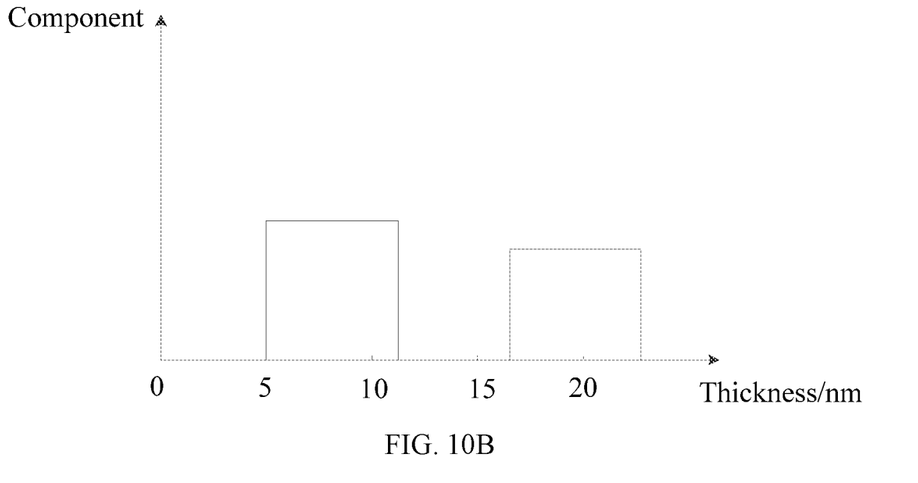

In this embodiment, the change of the component of Al along the epitaxial direction is still appears to be the "sawtooth" periodic change curve, and a height of each "tooth" of the "sawtooth" is decreasing, but a width of each "tooth" is wider than a region of the "sawtooth" without "tooth", as shown in FIG. 10B.

In an embodiment of the present application, as shown in FIG. 6A, a source region and a drain region located on both sides of the gate region are further defined on the surface of the barrier layer 24, a source electrode 6 is formed in the source region and in ohmic contact with the barrier layer 24, and a drain electrode 7 is formed in the drain region and in ohmic contact with the barrier layer 24. The p-type semiconductor material layer 5 may be directly used as a gate electrode (as shown in FIG. 6A), or an electrode material 51 may also be fabricated on the p-type semiconductor material layer 5 to serve as a gate electrode (as shown in FIG. 6C). It should also be understood that, the source electrode 6, the drain electrode 7 and the electrode material 51 on the p-type semiconductor material layer 5 may be made of a metal material, for example nickel alloy, or may be made of a metal oxide or semiconductor material. The specific material used for preparing the source electrode 6, the source electrode 7 and the electrode material 51 on the p-type semiconductor material layer 5 is not limited in the present application.

Figure 6D:
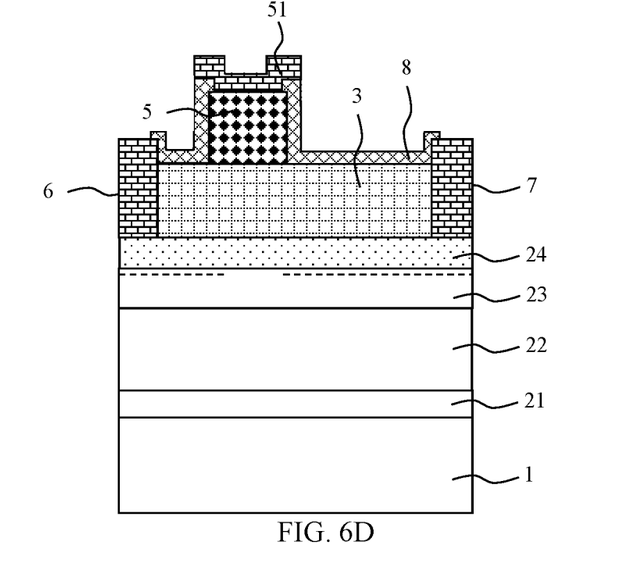

In an embodiment of the present application, as shown in FIG. 6D, in a case where the electrode material 51 is to be fabricated on the p-type semiconductor material layer 5 to serve as the gate electrode, a passivation layer 8 may be first prepared on an exposed surface of the composition change layer 3, as shown in FIG. 6D.

Specifically, based on the semiconductor structure shown in FIG. 5A, before preparing the source electrode 6 and the drain electrode 7, the portions of the composition change layer 3 above the source region and above the drain region need to be etched away to expose the source region and the drain region on a surface of the barrier layer 24, so as to prepare the source electrode 6 and the drain electrode 7, and finally a semiconductor structure shown in FIG. 6A is formed.

In an embodiment of the present application, in order to further improve the performance of the semiconductor structure and further reduce the density of a two-dimensional electron gas in the channel layer 23 under the gate region, as shown in FIG. 5B, the semiconductor structure further includes a groove 4, formed in the gate region, extending toward the barrier layer 24, and a portion of the p-type semiconductor material layer 5 fills the groove 4.

It should also be understood that the specific shape of the p-type semiconductor material layer 5 may vary in accordance with a width of the groove 4 in the gate region. Although, in a structure shown in FIG. 5B, a middle portion of the p-type semiconductor material layer 5 is recessed to form a T-shaped structure, in a case where the width of the groove 4 is relatively small (e.g., less than 0.25 μm), the middle portion of the p-type semiconductor material layer 5 may also be in a folded state, which is not limited in the present application.

In an embodiment of the present application, as shown in FIG. 5D, the barrier layer 24 may also has a sandwich structure. The sandwich structure includes a first outer interlayer 241 formed on a surface of the channel layer 23, a second outer interlayer 243, and a middle layer 242 sandwiched between the first outer interlayer 241 and the second outer interlayer 243. It should be understood that materials of the first outer interlayer 241, the middle layer 242 and the second outer interlayer 243 may be adjusted according to the material of the channel layer 23. For example, by taking a GaN-based material as an example, in a case where the channel layer 23 is made of GaN, the first outer interlayer 241 and the second outer interlayer 243 may be made of AlGaN or AlInGaN, and the middle layer 242 may be made of GaN, where a content of each of Al, In and Ga may vary from 0 to 1. However, the materials of the first outer interlayer 241, the middle layer 242 and the second outer interlayer 243 are not specifically limited in the present application.

It should be understood that although the groove 4 in FIG. 5B completely penetrates the composition change layer 3 and rests on a bottom surface of the composition change layer 3, in some other embodiments of the present application, the groove 4 may not only completely penetrate the composition change layer 3, but also penetrates a portion of the barrier layer 24. For example, as shown in FIG. 5D, in a case where the barrier layer 24 has a sandwich structure, the groove 4 may penetrate to the middle layer 242 of the sandwich structure of the barrier layer 24. In this case, the middle layer 242 may be function as a stop layer in the local etching process of forming the groove 4, so as to protect the first outer interlayer 241 on a surface of the channel layer 23 from being damaged by the local etching process. However, the preparation depth of the groove 4 is not strictly limited in the present application as long as the p-type semiconductor material layer 5 inside the groove 4 can pinch off an n-type conductive layer under a gate electrode so as to realize the semiconductor structure. In another embodiment of the present application, as shown in FIG. 5E, the groove 4 may only penetrate a portion of the composition change layer 3, and the bottom surface of the groove 4 rest on the inside of the composition change layer 3. The preparation depth of the groove 4 is not strictly limited in the present application as long as the p-type semiconductor material layer 5 inside the groove 4 can pinch off the n-type conductive layer under the gate electrode so as to realize the semiconductor structure.

It should be understood that, although this specification has been described by implementations, not every implementation includes only one independent technical solution. The narration mode of this specification is merely for clarity, those skilled in the art shall regard this specification as a whole, and the technical solutions in various implementations may also be properly combined to form other implementations that may be understood by those skilled in the art.

The series of detailed descriptions listed above are merely specific descriptions of feasible implementations and not intended to limit the protection scope of the present application. Equivalent implementations or alterations made without departing from the technical spirit of the present application shall fall into the protection scope of the present application.

What is claimed is:

1. A semiconductor structure, comprising:
    a channel layer;
    a barrier layer located on the channel layer;
    a composition change layer located on the barrier layer, a gate region being defined on a surface of the composition change layer, and a material of the composition change layer comprising at least one composition change element; and
    a p-type semiconductor material layer located in the gate region of the composition change layer, wherein
    a change curve of content of the at least one composition change element along an epitaxial direction comprises a periodic change and is used for controlling an etching process of a p-type semiconductor material layer by monitoring the content of the at least one composition change element.

2. The semiconductor structure according to claim 1, wherein the change curve of the content of the at least one composition change element along an epitaxial direction further comprises at least two combinations of following change stages: a periodic change, an increasing change, and a decreasing change.

3. The semiconductor structure according to claim 1, wherein the composition change layer adopts a periodic structure, and the periodic structure comprises at least one period layer sequentially superimposed along the epitaxial direction, each period layer of the at least one period layer comprises a first periodic layer and a second periodic layer sequentially superimposed along the epitaxial direction, and the at least one composition change element exists in the first periodic layer.

4. The semiconductor structure according to claim 3, wherein a material of the composition change layer is a III-V compound, a material of the first periodic layer comprises at least one Group III element and at least one Group V element, and a material of the second periodic layer comprises at least one Group III element and at least one Group V element.

5. The semiconductor structure according to claim 3, wherein the at least one period layer comprises a plurality of period layers, the content of the at least one composition change element of the first periodic layer in the plurality of period layers is different from each other.

6. The semiconductor structure according to claim 1, wherein the composition change layer adopts a periodic structure, and the periodic structure comprises at least one period layer sequentially superimposed along the epitaxial direction, each period layer of the at least one period layer comprises a first periodic layer and a second periodic layer sequentially superimposed along the epitaxial direction, and the at least one composition change element exits in the second periodic layer.

7. The semiconductor structure according to claim 6, wherein a material of the composition change layer is a III-V compound, a material of the first periodic layer comprises at least one Group III element and at least one Group V element, a material of the second periodic layer comprises at least one Group III element and at least one Group V element.

8. The semiconductor structure according to claim 1, wherein the at least one composition change element comprises a Group III element.

9. The semiconductor structure according to claim 1, wherein the at least one composition change element comprises a Group V element.

10. The semiconductor structure according to claim 1, further comprising:
    a groove located in the gate region of the composition change layer;
    wherein at least a portion of the p-type semiconductor material layer fills the groove.

11. The semiconductor structure according to claim 10, wherein the groove penetrates the composition change layer.

12. The semiconductor structure according to claim 1, wherein the p-type semiconductor material layer comprises one or more of p-type diamond, p-type NiO, p-type GaN, p-type AlGaN, p-type InGaN, and p-type GaN/AlGaN.

13. The semiconductor structure according to claim 1, wherein a source region and a drain region on both sides of the gate region are defined on a surface of the barrier layer, and the semiconductor structure further comprises:
a source electrode located in the source region and in ohmic contact with the barrier layer; and
a drain electrode located in the drain region and in ohmic contact with the barrier layer.

14. The semiconductor structure according to claim 1, further comprising:
a nucleating layer and a buffer layer sequentially located under the channel layer.

15. The semiconductor structure according to claim 1, wherein the composition change layer adopts a periodic structure, the periodic structure comprises at least one period layer sequentially superimposed along the epitaxial direction, and a thickness of each period layer of the at least one period layer is the same.

16. The semiconductor structure according to claim 1, wherein the composition change layer adopts a periodic structure, the periodic structure comprises at least one period layer sequentially superimposed along the epitaxial direction, each period layer of the at least one period layer comprises a first periodic layer and a second periodic layer sequentially superimposed along the epitaxial direction, and a thickness of the first periodic layer is equal to a thickness of the second periodic layer.

17. A method for manufacturing a semiconductor structure, comprising:
sequentially forming a channel layer and a barrier layer;
forming a composition change layer on the barrier layer, a gate region being defined on a surface of the composition change layer, and a material of the composition change layer comprising at least one composition change element;
forming a p-type semiconductor material layer on the surface of the composition change layer;
performing selective etching on the p-type semiconductor material layer to reserve the p-type semiconductor material layer in the gate region, and monitoring content of the at least one composition change element; and
stopping the selective etching in an event that a preset change curve is found.

18. The method according to claim 17, further comprising:
before forming the p-type semiconductor material layer on the surface of the composition change layer, forming, in the gate region of the composition change layer, a groove extending toward the barrier layer,
wherein the p-type semiconductor material layer covers the surface of the composition change layer and fills the groove.

19. The method according to claim 17, wherein a source region and a drain region located on both sides of the gate region are defined on a surface of the barrier layer, the method further comprises:
etching away a portion of the semiconductor structure above the source region to expose the barrier layer, and forming, in the source region, a source electrode in ohmic contact with the barrier layer; and
etching away a portion of the semiconductor structure above the drain region to expose the barrier layer, and forming, in the drain region, a drain electrode in ohmic contact with the barrier layer.

20. A system for manufacturing a semiconductor structure for performing the method for manufacturing a semiconductor structure according to claim 17, comprising:
a monitoring system configured to monitor content of at least one composition change element during selective etching of a p-type semiconductor material of the semiconductor structure; and
an etching system configured to stop the selective etching in an event that a preset change curve is found.

* * * * *